United States Patent
Kocsis et al.

(10) Patent No.: US 11,480,874 B2
(45) Date of Patent: Oct. 25, 2022

(54) PATTERNED ORGANOMETALLIC PHOTORESISTS AND METHODS OF PATTERNING

(71) Applicant: Inpria Corporation, Corvallis, OR (US)

(72) Inventors: Michael Kocsis, Leuven (BE); Peter De Schepper, Wijnegem (BE); Michael Greer, Corvallis, OR (US); Shu-Hao Chang, Leuven (BE)

(73) Assignee: Inpria Corporation, Corvallis, OR (US)

( * ) Notice: Subject to any disclaimer, the term of this patent is extended or adjusted under 35 U.S.C. 154(b) by 210 days.

(21) Appl. No.: 16/654,080

(22) Filed: Oct. 16, 2019

(65) Prior Publication Data

US 2020/0124970 A1 Apr. 23, 2020

Related U.S. Application Data

(60) Provisional application No. 62/746,808, filed on Oct. 17, 2018.

(51) Int. Cl.
| | | |
|---|---|---|
| *G03F 7/004* | (2006.01) | |
| *G03F 7/32* | (2006.01) | |
| *G03F 7/42* | (2006.01) | |
| *G03F 7/40* | (2006.01) | |

(52) U.S. Cl.
CPC ............ *G03F 7/0042* (2013.01); *G03F 7/322* (2013.01); *G03F 7/40* (2013.01); *G03F 7/425* (2013.01)

(58) Field of Classification Search
None
See application file for complete search history.

(56) References Cited

U.S. PATENT DOCUMENTS

| | | | |
|---|---|---|---|
| 5,700,629 | A | 12/1997 | Kakumaru |
| 8,822,129 | B2 | 9/2014 | Iwato et al. |
| 9,176,377 | B2 | 11/2015 | Stowers et al. |
| 9,281,207 | B2 | 3/2016 | Stowers et al. |
| 9,310,684 | B2 | 4/2016 | Meyers et al. |
| 9,372,402 | B2 | 6/2016 | Freedman et al. |
| 9,778,561 | B2 | 10/2017 | Marks et al. |
| 9,996,004 | B2 | 6/2018 | Smith et al. |
| 10,228,618 | B2 | 3/2019 | Meyers et al. |
| 10,627,719 | B2 | 4/2020 | Waller et al. |
| 2002/0076495 | A1 | 6/2002 | Maloney et al. |
| 2011/0244403 | A1 | 10/2011 | Carcasi et al. |
| 2013/0224652 | A1 | 8/2013 | Bass et al. |
| 2014/0212811 | A1 | 7/2014 | Inoue et al. |
| 2015/0056542 | A1* | 2/2015 | Meyers ............... G03F 7/30 430/9 |
| 2015/0185620 | A1* | 7/2015 | Liu ............... G03F 7/0392 430/319 |
| 2015/0234272 | A1 | 8/2015 | Sarma et al. |
| 2015/0323866 | A1 | 11/2015 | Namai et al. |
| 2016/0011505 | A1 | 1/2016 | Stowers et al. |
| 2016/0116839 | A1* | 4/2016 | Meyers ............... G03F 7/0043 430/11 |
| 2016/0187783 | A1* | 6/2016 | Kaur ............... C07C 309/40 430/312 |
| 2017/0102612 | A1 | 4/2017 | Meyers et al. |
| 2017/0146909 | A1 | 5/2017 | Smith et al. |
| 2018/0046086 | A1 | 2/2018 | Waller et al. |
| 2018/0173096 | A1 | 6/2018 | Zi et al. |
| 2018/0321589 | A1 | 11/2018 | Tsuchimura et al. |
| 2019/0053001 | A1 | 2/2019 | Tanabe et al. |
| 2019/0137870 | A1 | 5/2019 | Meyers et al. |
| 2019/0308998 | A1 | 10/2019 | Cardineau et al. |
| 2019/0315782 | A1 | 10/2019 | Edson et al. |

FOREIGN PATENT DOCUMENTS

| | | |
|---|---|---|
| JP | 2013-080004 A | 5/2013 |
| WO | 2014-132992 A | 9/2014 |
| WO | 2017-138267 A1 | 8/2017 |
| WO | 2020-132281 A1 | 6/2020 |
| WO | 2020-264556 A1 | 12/2020 |

OTHER PUBLICATIONS

International Search Report And Written Opinion For Application No. PCT/US2019/056183 dated Jan. 30, 2020.
Chandrasekhar et al., "Organotin assemblies containing Sn—O bonds", Coord. Chem. Rev., vol. 235, p. 1-52, (2002).
Hotalen et al., "Advanced Development Techniques for Metal-Based EUV Resists", Proc. of SPIE vol. 10143 1014309-1, Mar. 6, 2020.
Pleasseraud et al., "Di-nbutyltin oxide as a chemical carbon dioxide capturer", J. Organometallic Chem., vol. 695, p. 1618-1626, (2010).
Pleasseraud et al., "Unprecedented Hexa- and Undecanuclear Frameworks of Two New Tin(IV) Oxo Clusters Resulting from Partial Debenzylation Reactions", Z. Naturforsch, vol. 65b, p. 1293-1300, (2010). (Abstract Only).
Pleasseraud et al., "A New Dodecanuclear Organostannoxane", Z. Naturforsch, vol. 66b, p. 262-268, (2011).
Zheng et al., "A New System in Organooxotin Cluster Chemistry Incorporating Inorganic and Organic Spacers between Two Ladders Each Containing Five Tin Atoms", Chem. Eur. J., vol. 10, p. 3761-3768, (2010). (Abstract Only).

* cited by examiner

*Primary Examiner* — Kathleen Duda
(74) *Attorney, Agent, or Firm* — Christensen, Fonder, Dardi & Herbert PLLC; Diane E. Bennett; Peter S. Dardi

(57) ABSTRACT

A rinse process is described for processing an initially patterned structure formed with an organometallic radiation sensitive material, in which the rinse process can remove portions of the composition remaining after pattern development to make the patterned structure more uniform such that a greater fraction of patterned structures can meet specifications. The radiation sensitive material can comprise alkyl tin oxide hydroxide compositions. The rinsing process can be effectively used to improve patterning of fine structures using extreme ultraviolet light.

23 Claims, 5 Drawing Sheets

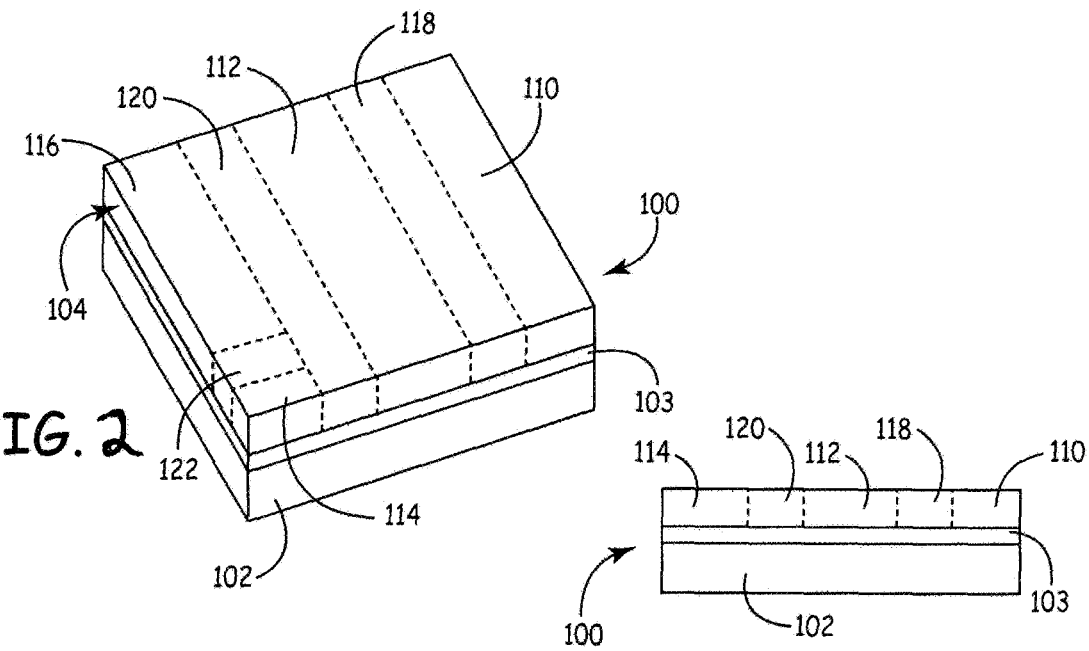
FIG. 2
FIG. 3
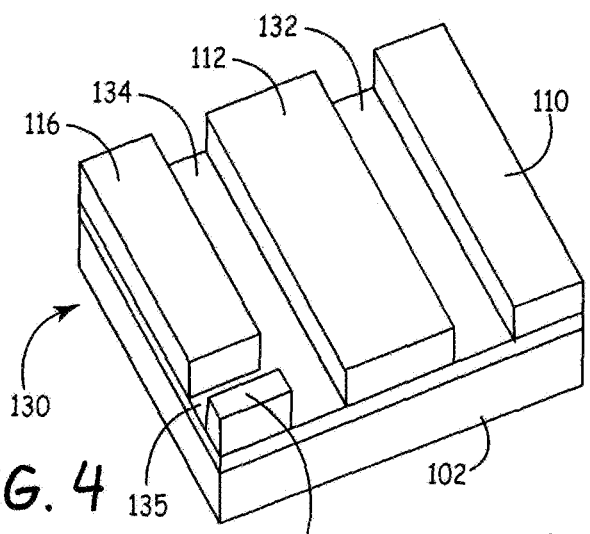
FIG. 4
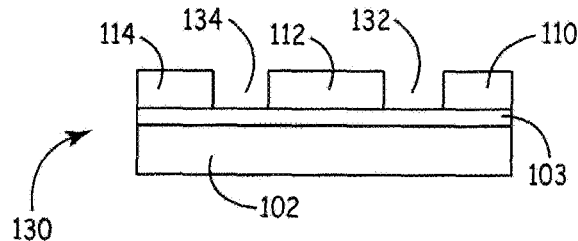
FIG. 5

| | No treatment | 10s LD | 20s LD | 30s LD |
|---|---|---|---|---|
| P32 | | | | |
| P32 DOM1 | 16.3/3.8 | 14.7/3.8 | 11.4/4.1 | 9.7/4.2 |
| P32 DOM2 | 17.6/3.9 | 15.8/3.9 | 12.8/4.1 | 11.1/4.1 |
| P32 DOM4 | 20.8/7.8 | 19.2/5.9 | 16.9/5.0 | 14.6/4.4 |
| P32 DOM5 | 21.0/9.42 | 20.4/7.5 | 19.0/5.5 | 17.0/4.7 |

Fig. 9

PATTERNED ORGANOMETALLIC PHOTORESISTS AND METHODS OF PATTERNING

CROSS REFERENCE TO RELATED APPLICATIONS

This application claims priority to U.S. provisional patent application 62/746,808, filed Oct. 17, 2018, to Kocsis et al., entitled "Patterned Organometallic Photoresists and Method of Patterning," incorporated herein by reference.

FIELD

The present disclosure relates to patterned organometallic photoresists and methods of patterning organometallic photoresists on a substrate using radiation based lithography, e.g., extreme ultraviolet (EUV) lithography or e-beam lithography.

BACKGROUND OF THE DISCLOSURE

Patterning technologies can be used to form semiconductor-based and other electronic devices having complex, fine structures. In the fields of micro- and nanofabrication, integrated circuits have become very small. This has been driven, in part, by the steady decrease in circuit size and the increase in circuit componentry density.

Photolithography technologies have been used to fabricate and manufacture such integrated circuits. In photolithography, the patterning of photoresist generally involves several steps including: exposing the photoresist to a selected energy source, through a mask, to record a latent image and then developing and removing selected regions of the photoresist. The exposed regions of the photoresist are transformed to make patterned regions selectively removable. For a positive-tone photoresist, the exposed regions are removed to leave the unexposed regions. For a negative-tone photoresist, the unexposed regions are removed to leave the exposed regions.

Extreme ultraviolet (EUV) lithography is a specific photolithographic technology making possible the continued reduction in feature sizes in semiconductor manufacturing. The short wavelength ($\lambda=13.5$ nm) of EUV radiation allows generation of high density patterns of light and, thereby, fabrication of small, dense features by photolithography. In the EUV photolithographic process, the photoresist is deposited as a thin film, exposed with a pattern of EUV radiation to create a latent image, and then developed with a liquid, such as an organic solvent, to produce a developed pattern of the resist.

SUMMARY

In a first aspect, the invention pertains to a method for forming a pattern in a radiation sensitive organometallic resist film on a surface of a substrate, the method comprising rinsing an initial patterned structure with a rinse solution to remove a portion of developed photoresist to control pattern dimensions, quality, and/or resolution and to form an adjusted patterned structure. The rinsing step generally comprises removal of underexposed portions of the developed photoresist. In some embodiments, the initial patterned structure can be formed by (i) coating the surface of the substrate with an organometallic radiation sensitive resist material to form the radiation sensitive resist film, (ii) exposing the radiation sensitive resist film to patterned radiation to form an exposed film with exposed portions and unexposed portions, and (iii) contacting the exposed film with a developing solution to form developed photoresist in which generally either the unexposed portions or the exposed portions are selectively soluble in the developing solution. The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 2 is a schematic perspective view of a radiation patterned structure with a latent image.

FIG. 3 is a side plan view of the structure of FIG. 2.

FIG. 4 is a schematic perspective view of the structure of FIG. 2 after development of the latent image to remove un-irradiated coating material to form a patterned structure.

FIG. 5 is a side view of the patterned structure of FIG. 4.

FIG. 9 is an array of 16 scanning electron micrographs (SEM) of a silicon substrate with organometallic resist patterned via EUV lithography to form 32-nm pitch lines (P32) with the top four SEM images corresponding to 16 nm line spacing (DOM1), with the second row of four SEM images corresponding to 17-nm line spacing (DOM2), with the third row of SEM images corresponding to 19-nm line spacing (DOM4), and with the fourth row of SEM images corresponding to 20-nm line spacing (DOM5), in which the four images in each row from left to right correspond to no rinse, 10 second TMAH rinse, 20 second TMAH rinse, and thirty second TMAH rinse, respectively.

Figure 1:
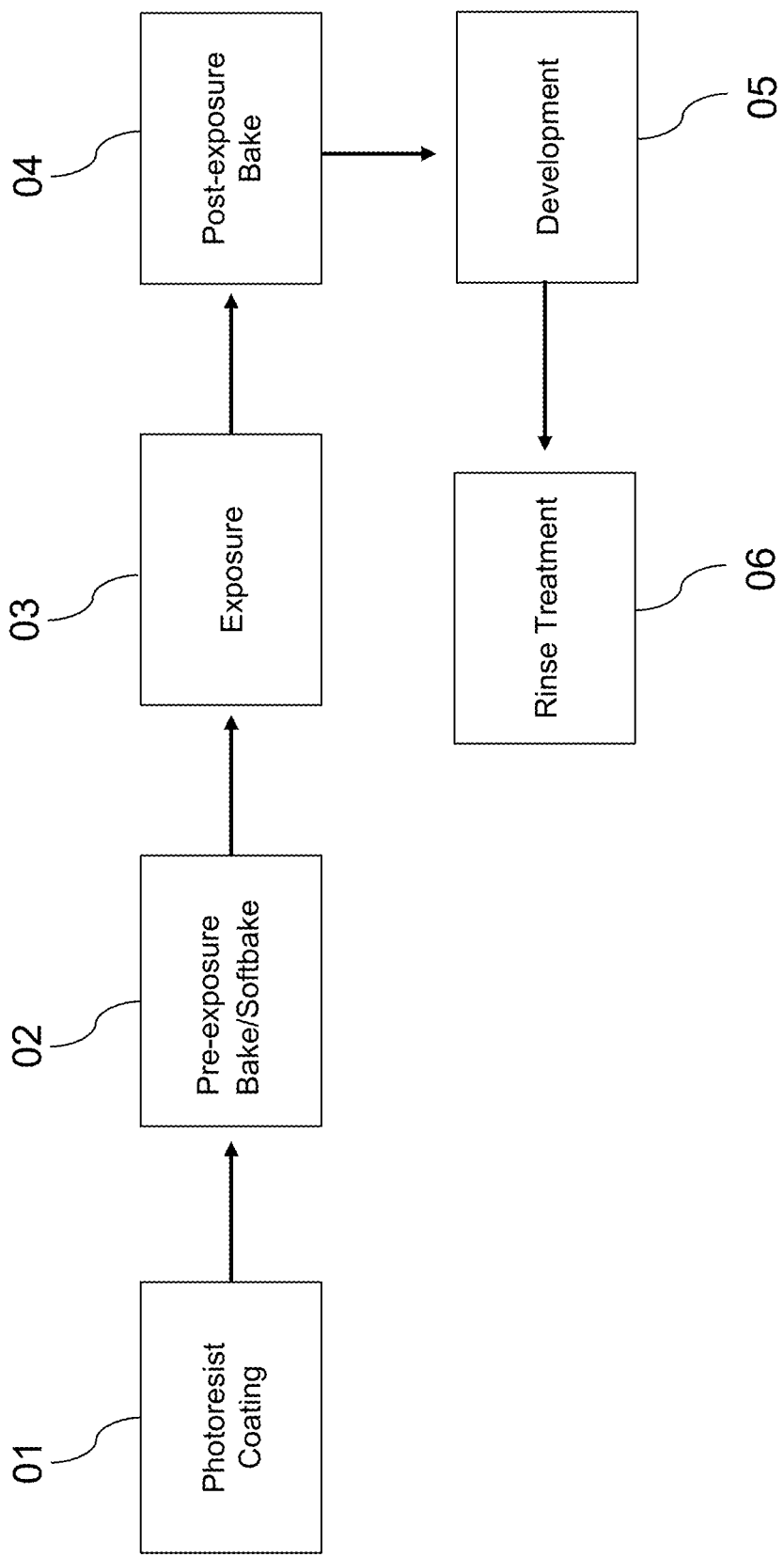
FIG. 1 is a flow chart for a photolithographic process according to embodiments of the present disclosure.

While the embodiments of the disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Improved processing of patterns formed using organometallic radiation sensitive compositions provides for improved uniformity and reproducibility of patterns formed with very fine lines. Organometallic based radiation sensitive resists provide the ability to achieve the formation of very fine patterns, especially using extreme ultraviolet light. In particular, alkyl tin oxide hydroxide compositions can be deployed with commercially acceptable processing approaches. The significant EUV absorption of these compositions along with the ability to achieve very high etch contrasts provides for the formation of very fine patterning. Also, these compositions can function as either negative resists or positive resists. This unusual property of potential processing as a positive resist and a negative resist has been exploited through the use of sequential developers to improve the uniformity of a lithographic pattern. In particular, a first development step can be performed to form the pattern, and a second mild development directed to the material not removed by the first development can clean up the initial developed pattern with the second development solution. The second development step can involve removal of partially irradiated material and edges of the pattern remaining after the first development step. Generally, one development liquid is an organic solvent and the second development solution is an aqueous alkaline solution. In this way, improved patterning can be accomplished that can reduce product rejection rate for failure to achieve performance according to specification. The ability to reduce waste due to failure of a product can provide significant value for commercial production.

The patterning to form small radiation based lithographic features involves projecting radiation, such as extreme ultraviolet radiation, through a mask based on the pattern onto a radiation sensitive material. Of course, the irradiation process is not a mathematically precise process. Thus, near the edges of the pattern, there can be blurring of the pattern due to various potential causes, such as imperfections in the mask and irradiation non-uniformities in general, as well as stochastic and/or process fluctuations. Thus, when the pattern is developed using a developing solution, corresponding imperfections may be present in the developed pattern. For the alkyl tin oxide hydroxide compositions described herein, the un-irradiated composition is generally soluble in an organic solvent, and the irradiated resist generally is soluble in a basic (i.e., alkaline) aqueous solution. The material remaining after a development step can be subjected to a developer designed to remove the remaining composition. By performing a second differential development under mild conditions, such as a short period of time, partially irradiated material can be removed along with a small amount of the remaining pattern based on the first development step. The second development step tends to improve the uniformity of the patterning process to reduce the failure of corresponding products to meet specifications.

Patterning of very small features has been accomplished with recently developed organometallic radiation resist compositions. In particular, alkyl tin oxide hydroxide compositions provide desirable patterning performance, based at least in part on a high EUV absorption associated with the tin and a very high etch contrast upon radiation driven fragmentation of the alkyl-tin bond. The alkyl tin oxide hydroxide compositions provide an added feature of being able to function as either a negative resist, in which the radiation exposed regions remain after an initial development, or as a positive resist, in which the unexposed regions remain after an initial development. In any case, the development process is intended to involve processing conditions that do not significantly alter the remaining portions of the structure. For the alkyl tin oxide hydroxide compositions, the negative resist patterning can be performed with an organic solvent developing agent that dissolves the un-irradiated resist, and the positive resist patterning can be performed with an aqueous alkaline composition that dissolves the irradiated resist. This ability to perform under negative tone processing or positive tone processing is effectively exploited in the present combined processing to yield a more consistent and uniform pattern on a very small scale.

For consistent patterning performance with improved compatibility with existing process equipment, monoalkyl tin oxide hydroxide compositions have been found to be particularly effective for small pattern formation. The monoalkyl tin oxide hydroxide compositions are generally synthesized from compositions represented by the formula $RSnX_3$, where R is the alkyl group and X is a hydrolyzable group, such as NR'R" (amide group) or $OR_0$ (alkoxide group), where R', R" and $R_0$ are hydrocarbyl groups. The reaction to form the alkyl tin oxide hydroxide can be performed in solution or alternatively in situ after coating onto the substrate to be processed. While desired processing can evolve, the current desired processing approach involves the deposition of a monoalkyl tin trialkoxide composition with subsequent in situ hydrolysis to form the oxide hydroxide composition with release of an alcohol vapor byproduct that can be readily removed. The following discussion provides a more general discussion along with more details regarding the specific processing.

Referring to FIG. 1, in an outline of the present process for improved fine patterning, a radiation based patterning process, e.g., an extreme ultraviolet (EUV) lithographic process, photoresist material is deposited or coated as a thin film on a substrate 01, pre-exposure/softbaked 02, exposed with a pattern of radiation to create a latent image 03, post-exposure baked 04, and then developed 05 with a liquid, typically an organic solvent, to produce a developed pattern of the resist. This process can leave residual, unexposed or underexposed organometallic photoresist between the patterned features, which can skew the quality of the patterned profiles. Accordingly, the process according to embodiments of the present disclosure can further include rinsing 06 the photoresist to remove the residue. This process is described in detail below.

Coating

A coating of the organometallic resist composition can be formed through the deposition of a precursor solution onto a selected substrate. A substrate generally presents a surface onto which the coating material can be deposited, and the substrate may comprise a plurality of layers in which the surface relates to an upper most layer. The substrate surface can be treated to prepare the surface for adhesion of the coating material. Prior to preparation of the surface, the surface can be cleaned and/or smoothed as appropriate. Suitable substrate surfaces can comprise any reasonable material. Some substrates of interest include, for example, silicon wafers, silica substrates, other inorganic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable organometallic materials described herein. Suitable polymers can include, for example, polycarbonates, polyimides, polyesters, polyalkenes, copolymers thereof and mixtures thereof. In general, it is desirable for the substrate to have a flat surface, especially for high resolution applications.

Organometallic radiation sensitive resists have been developed based on alkyl tin compositions, such as alkyltin oxide hydroxide, approximately represented by the formula $R_zSnO_{(2-z/2-x/2)}(OH)_x$, where $0<x<3$, $0<z\leq2$, $x+z\leq4$, and R is a hydrocarbyl group forming a carbon bond with the tin atom. Particularly effective forms of these compositions are monoalkytin oxide hydroxide, in which z=1 in the above formula. Alkyl tin based photoresist materials are further described in U.S. Pat. No. 9,310,684 to Meyers et al., entitled "Organometallic Solution Based High Resolution Patterning Compositions," and U.S. Patent Application Publication Nos. 2016/0116839 A1 to Meyers et al., entitled "Organometallic Solution Based High Resolution Patterning Compositions and Corresponding Methods," and 2017/0102612 A1 to Meyers et al. (hereinafter the '612 application), entitled "Organotin Oxide Hydroxide Patterning Compositions, Precursors, and Patterning," each of which are incorporated herein by reference.

In situ hydrolysis of alkyl tin amides and/or alkyl tin alkoxides provides for the deposition of alkyl tin oxide hydroxide compositions. The discussion herein focuses on the monoalkyl tin compositions, although the more general alkyl tin compositions can similarly be used. The hydrolysis and condensation reactions that can transform the compositions with hydrolyzable groups (X), such as amide or alkoxide groups, are indicated in the following reactions:

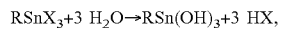
$$RSnX_3 + 3\ H_2O \rightarrow RSn(OH)_3 + 3\ HX,$$

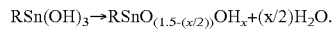
$$RSn(OH)_3 \rightarrow RSnO_{(1.5-(x/2))}OH_x + (x/2)H_2O.$$

If the hydrolysis products HX are sufficiently volatile, in situ hydrolysis can be performed with water vapor during the substrate coating process with the corresponding removal of the by-product HX.

The monoalkyl tin triamide compositions generally can be represented by the formula $RSn(NR')_3$, where R and R' are independently an alkyl or a cycloalkyl with 1-31 carbon atoms with one or more carbon atoms optionally substituted with one of more heteroatom functional groups containing O, N, Si, and/or halogen atoms or an alkyl or a cycloalkyl further functionalized with a phenyl or cyano group. In some embodiments, R' can comprise ≤10 carbon atoms and can be, for example, methyl, ethyl, propyl, isopropyl, butyl, t-butyl, isobutyl, or t-amyl. The R group can be a linear, branched, (i.e., secondary or tertiary at the metal-bonded carbon atom), or cyclic hydrocarbyl group. Each R group individually and generally has from 1 to 31 carbon atoms with 3 to 31 carbon atoms for the group with a secondary-bonded carbon atom and 4 to 31 carbon atoms for the group with a tertiary-bonded carbon atom. In particular, branched alkyl ligands can be desirable for some patterning compositions where the compound can be represented as $R^1R^2R^3CSn(NR')_3$, where $R^1$ and $R^2$ are independently an alkyl group with 1-10 carbon atoms, and $R^3$ is hydrogen or an alkyl group with 1-10 carbon atoms. As noted below, this representation of alkyl ligand R is similarly applicable to the other embodiments generally with $R^1R^2R^3CSn(X)_3$, with X corresponding to the trialkoxide or triamide moieties. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —$CH_2CH_3$), sec-butyl ($R^1$ is methyl, $R^2$ is —$CH_2CH_3$, and $R^3$ is hydrogen), neopentyl ($R^1$ and $R^2$ are hydrogen, and $R^3$ is —$C(CH_3)_3$), cyclohexyl, cyclopentyl, cyclobutyl, and cyclopropyl. Examples of suitable cyclic groups include, for example, 1-adamantyl (—$C(CH_2)_3$ $(CH)_3(CH_2)_3$ or tricyclo(3.3.1.13,7) decane bonded to the metal at a tertiary carbon) and 2-adamantyl (—$CH(CH)_2$ $(CH_2)_4(CH)_2(CH_2)$ or tricyclo(3.3.1.13,7) decane bonded to the metal at a secondary carbon). In other embodiments hydrocarbyl groups may include aryl or alkenyl groups, for example, benzyl or allyl, or alkynyl groups. In other embodiments the hydrocarbyl ligand R may include any group consisting solely of C and H and containing 1-31 carbon atoms. In summary, some examples of suitable alkyl groups bonded to tin include, for example, linear or branched alkyl (i-Pr (($CH_3)_2CH$—), t-Bu (($CH_3)_3C$—), Me ($CH_3$—), n-Bu ($CH_3CH_2CH_2CH_2$—)), cyclo-alkyl (cyclo-propyl, cyclo-butyl, cyclo-pentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups or combinations thereof.

The alkyl tin trialkoxide compositions can be represented by the formula $RSn(OR^o)_3$. The alkyl tin trialkoxide can be synthesized from alkyl tin triamide, although U.S. patent application Ser. No. 15/950,292 to Edson et al., entitled "Monoalkyl Tin Compounds with Low Polyalkyl Contamination, Their Compositions and Methods", incorporated herein by reference, also describes the synthesis of monoalkyl tin trialkoxides from alkyl triamido tin and other synthesis pathways that may be used. The alkyl triamido tin compositions can be represented by the formula $RSn(NR"COR''')_3$. The R groups in the formulas for the alkyl tin trialkoxide and alkyl triamido tin compositions can be the same R groups as summarized above for the alkyl tin triamide compositions, and the corresponding discussion of these R groups above is as if copied in this paragraph in its entirety. The monoalkyl triamido tin compositions are not discussed further herein. For the alkoxide ligands —$OR^o$, the $R^o$ groups can be independently hydrocarbon groups with 1-10 carbon atoms, such as methyl groups, ethyl groups, or the like.

In general, any suitable coating process can be used to deliver the precursor solution to a substrate. Suitable coating approaches can include, for example, spin coating, spray coating, dip coating, vapor deposition, knife edge coating, printing, such as inkjet printing and screen printing, and the like. Vapor deposition is discussed in the '612 application cited above. To form a precursor solution, the resist composition can generally be dissolved in a suitable organic solvent. While some process parameters are dependent on the specific composition of the organometallic resist, for the tin based resists described above, tin concentrations generally can be in the range of about 1 mM to about 1 M, in further embodiments from about 2 mM to about 750 mM, and in other embodiments from about 5 mM to about 500 mM by amount of tin. Some of these coating approaches form patterns of coating material during the coating process, although the resolution available currently from printing or the like has a significantly lower level of resolution than available from radiation based patterning, as described herein.

If patterning is performed using radiation, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge beam removal step or the like can be performed with water or other suitable rinse to remove any edge bead. A person of ordinary skill in the art will recognize that additional ranges of spin coating parameters within the explicit ranges above are contemplated and are within the present disclosure.

The thickness of the coating generally can be a function of the precursor solution concentration, viscosity, and the spin speed. For other coating processes, the thickness can generally also be adjusted through the selection of the coating parameters. In some embodiments, it can be desirable to use a thin coating to facilitate formation of small and highly resolved features. In some embodiments, the coating materials can have an average dry thickness prior to rinsing of no more than about 1 micron, in further embodiments no more than about 250 nanometers (nm), in additional embodiments from about 1 nanometers (nm) to about 50 nm, in other embodiments from about 1 nm to about 40 nm and in some embodiments from about 1 nm to about 25 nm. The rinsing process taught herein reduces the thickness of the developed resist pattern, which may be exposed or unexposed resist depending on the patterning performed. The rinsing process should generally not excessively remove material from the developed resist pattern, but the initial thickness of the dry resist coating materials can be selected in anticipation of the rinse process. The ranges of post rinse and post development coating thickness generally fall within the same ranges as presented above with the realization that the rinsing effectively reduces the upper limits of the post rinse coating thickness to some degree based on the percent of material removed in the rinse.

A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. An objective during the coating process can be to remove sufficient solvent to stabilize the coating material for further processing. The solvent removal process may not be quantitatively controlled with respect to specific amounts of solvent remaining in the coating material, and empirical evaluation of the resulting coating material properties generally can be performed to select processing conditions that are effective for the patterning process.

Pre-Exposure Bake

While heating may not be needed for successful application of the process, it can be desirable to heat the coated substrate to speed the processing and/or to increase the reproducibility of the process. For embodiments in which in situ hydrolysis is used to form the alkyl tin oxide hydroxide, the pre-exposure bake drives the hydrolysis to form the radiation sensitive patterning composition. In embodiments in which heat is applied to remove solvent and/or drive the hydrolysis, the coating material can be heated to temperatures from about 45° C. to about 150° C., in further embodiments from about 50° C. to about 130° C. and in other embodiments from about 60° C. to about 110° C. The heating for solvent removal can generally be performed for at least about 0.1 minute, in further embodiments from about 0.25 minutes to about 30 minutes, and in additional embodiments from about 0.50 minutes to about 10 minutes. A person of ordinary skill in the art will recognize that additional ranges of heating temperature and times within the explicit ranges above are contemplated and are within the present disclosure. For embodiments in which in situ hydrolysis is performed, the hydrolysis by product, such as an amine or alcohol, can be removed during this heating step if the byproduct is appropriately volatile.

Exposure

The coating material can be finely patterned using radiation. As noted above, the composition of the precursor solution and thereby the corresponding coating material can be designed for sufficient absorption of a desired form of radiation. The absorption of the radiation results in transfer of energy that breaks the alkyl tin bonds so that at least some of the alkyl ligands are no longer available to stabilize the material. With the absorption of a sufficient amount of radiation, the exposed coating material condenses, i.e. forms an enhanced metal oxo-hydroxo network, which may involve water absorbed from the ambient atmosphere. The radiation generally can be delivered according to a selected pattern. The radiation pattern is transferred to a corresponding pattern or latent image in the coating material with irradiated areas and un-irradiated areas. The irradiated areas comprise condensed coating material, and the un-irradiated areas comprise generally the as-formed coating material. Sharp edges can be formed upon development of the coating material with the removal of the un-irradiated coating material.

Radiation generally can be directed to the coated substrate through a mask or a radiation beam can be controllably scanned across the substrate. In general, the radiation can comprise electromagnetic radiation, an electron beam (beta radiation), or other suitable radiation. In general, electromagnetic radiation can have a desired wavelength or range of wavelengths, such as visible radiation, ultraviolet radiation or x-ray radiation. The resolution achievable for the radiation pattern is generally dependent on the radiation wavelength, and a higher resolution pattern generally can be achieved with shorter wavelength radiation. Thus, it can be desirable to use ultraviolet light, x-ray radiation or an electron beam to achieve particularly high resolution patterns.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. EUV light has been used for lithography at 13.5 nm, and this light is generated from a Xe or Sn plasma source excited using high energy lasers or discharge pulses. The monoalkyl tin oxide hydroxide based radiation sensitive compositions have been found to provide particularly effective resists for EUV and e-beam patterning, which are domains in which traditional organic resists have been considered to not deliver the full patterning capabilities of these lithographic processes.

The amount of electromagnetic radiation can be characterized by a fluence or dose which is obtained by the integrated radiative flux over the exposure time. Suitable radiation fluences can be from about 1 mJ/cm$^2$ to about 150 mJ/cm$^2$, in further embodiments from about 2 mJ/cm$^2$ to about 100 mJ/cm$^2$ and in further embodiments from about 3 mJ/cm$^2$ to about 50 mJ/cm$^2$. In an embodiment, the EUV radiation can be done at a dose of less than or equal to about 100 mJ/cm$^2$ or with an electron beam at a dose equivalent to or not exceeding about 2 mC/cm$^2$ at 30 kV. A person of ordinary skill in the art will recognize that additional ranges of radiation fluences within the explicit ranges above are contemplated and are within the present disclosure.

With electron beam lithography, the electron beam generally induces secondary electrons which generally modify the irradiated material. The resolution can be a function at least in part of the range of the secondary electrons in the material in which a higher resolution is generally believed to result from a shorter range of the secondary electrons. Based on high resolution achievable with electron lithography using the organometallic coating materials described herein, the range of the secondary electrons in the organometallic material is limited. Electron beams can be characterized by the energy of the beam, and suitable energies can range from about 5 eV to about 200 keV and in further embodiments from about 7.5 eV to about 100 keV. Proximity-corrected beam doses at 30 keV can range from about 0.1 microcoulombs per centimeter squared ($\mu C/cm^2$) to about 5 millicoulombs per centimeter squared ($mC/cm^2$), in further embodiments from about 0.5 $\mu C/cm^2$ to about 1 $mC/cm^2$ and in other embodiments from about 1 $\mu C/cm^2$ to about 100 $\mu C/cm^2$. A person of ordinary skill in the art can compute corresponding doses at other beam energies based on the teachings herein and will recognize that additional ranges of electron beam properties within the explicit ranges above are contemplated and are within the present disclosure.

Following exposure with radiation, the coating material is patterned with irradiated regions and un-irradiated regions. Referring to FIGS. 2 and 3, a patterned structure 100 is shown comprising a substrate 102, a thin film 103 and patterned coating material 104. Patterned coating material 104 comprises condensed regions 110, 112, 114, 116 of irradiated coating material and regions and uncondensed regions 118, 120, 122 of un-irradiated coating material. The patterned formed by condensed regions 110, 112, 114, 116 and uncondensed regions 118, 120 represent a latent image in to the coating material.

Based on the design of the organometallic coating material, there is a large contrast of material properties between the irradiated regions that have condensed coating material and the un-irradiated, uncondensed coating material. It has been surprisingly found that the contrast can be improved with a post-irradiation heat treatment, although satisfactory results can be achieved in some embodiments without post-irradiation heat treatment. The post-exposure heat treatment seems to anneal the irradiated coating material to improve its condensation without significantly condensing the un-irradiated regions of coating material.

Post-Exposure Bake

After completion of the exposure step, the coating materials can be heat treated to increase the etch contrast through further condensation of the exposed radiation sensitive composition. In some embodiments, the patterned coating material can be heated at a temperature from about 90° C. to about 600° C., in further embodiments from about 100° C. to about 400° C. and in additional embodiments from about 125° C. to about 300° C. The heating can be performed for at least about 10 seconds, in other embodiment for about 15 seconds to about 30 minutes, and in further embodiments from about 20 seconds to about 15 minutes. A person of ordinary skill in the art will recognize that additional ranges of temperatures and time for the heat treatment within the explicit ranges above are contemplated and are within the present disclosure. This high contrast in material properties further facilitates the formation of sharp lines in the pattern following development as described in the following section.

Development

Figure 6:
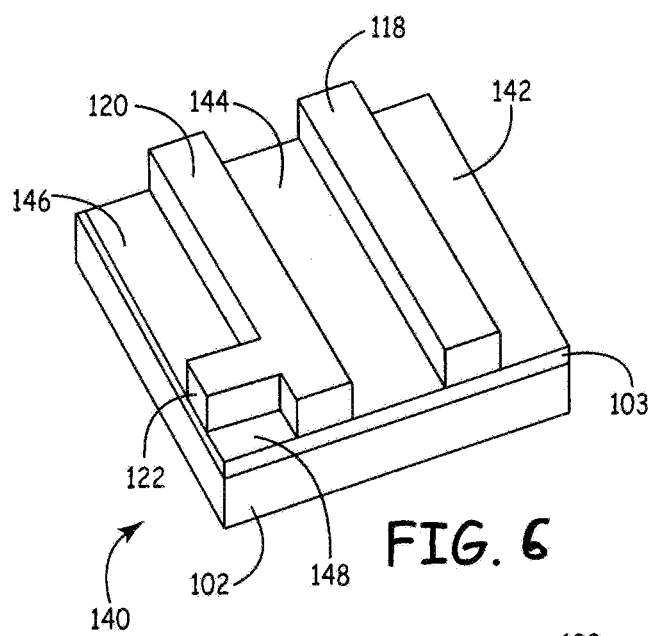
FIG. 6 is a schematic perspective view of the structure of FIG. 2 after development of the latent image to remove irradiated coating material to form a patterned structure.
Figure 7:
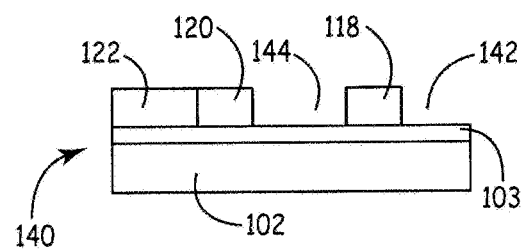
FIG. 7 is a side view of the patterned structure of FIG. 6.

With respect to negative tone imaging, referring to FIGS. 4 and 5, the latent image of the structure shown in FIGS. 2 and 3 has been developed through contact with a developer to form patterned structure 130. After development of the image, thin film 103 is exposed along the top surface through openings 132, 134, 135. Openings 132, 134, 135 are located at the positions of uncondensed regions 118, 120, 122 respectively. With respect to positive tone imaging, referring to FIGS. 6 and 7, the latent image of the structure shown in FIGS. 2 and 3 has been developed to form patterned structure 140. Patterned structure 140 has the conjugate image of patterned structure 130. Patterned structure 140 has thin film 103 exposed at positions of irradiated regions 110, 112, 114, 116 that are developed to form openings 142, 144, 146, 148.

The coating compositions with organic-stabilization ligands produce a material that is inherently hydrophobic. Irradiation to break at least some of the organic metal bonds converts the material into a less hydrophobic, i.e., more hydrophilic, material. This change in character provides for a significant contrast between the irradiated coating and non-irradiated coating that provides for the ability to do both positive tone patterning and negative tone patterning with the same resist composition. Specifically, the irradiated coating material condenses to some degree into more of a metal oxide composition; however, the degree of condensation generally is moderate without significant heating so that the irradiated material is relatively straightforward to develop with convenient developing agents.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. In particular, suitable developers include, for example, aromatic compounds (e.g., benzene, xylenes, toluene), esters (e.g., propylene glycol monomethyl ester acetate, ethyl acetate, ethyl lactate, n-butyl acetate, butyrolactone), alcohols (e.g., 4-methyl-2-pentanol, 1-butanol, isopropanol, 1-propanol, methanol), ketones (e.g., methyl ethyl ketone, acetone, cyclohexanone, 2-heptanone, 2-octanone), ethers (e.g., tetrahydrofuran, dioxane, anisole) and the like. The development can be performed for about 5 seconds to about 30 minutes, in further embodiments from about 8 seconds to about 15 minutes and in addition embodiments from about 10 seconds to about 10 minutes. A person of ordinary skill in the art will recognize that additional ranges within the explicit ranges above are contemplated and are within the present disclosure.

For positive tone imaging, the developer generally can be aqueous acids or bases. In some embodiments, aqueous bases can be used to obtain sharper images. To reduce contamination from the developer, it can be desirable to use a developer that does not have metal atoms. Thus, quaternary ammonium hydroxide compositions, such as tetraethylammonium hydroxide, tetrapropylammonium hydroxide, tetrabutylammonium hydroxide or combinations thereof, are desirable as developers. In general, the quaternary ammonium hydroxides of particular interest can be represented with the formula $R_4NOH$, where R=a methyl group, an ethyl group, a propyl group, a butyl group, or combinations thereof. The coating materials described herein generally can be developed with the same developer commonly used presently for polymer resists, specifically tetramethyl ammonium hydroxide (TMAH). Commercial TMAH is available at 2.38 weight percent, and this concentration can be used for the processing described herein. Furthermore, mixed quaternary tetraalkyl-ammonium hydroxides can be used. In general, the developer can comprise from about 0.5 to about 30 weight percent, in further embodiments from about 1 to about 25 weight percent and in other embodiments from about 1.25 to about 20 weight percent tetraalkylammonium hydroxide or similar quaternary ammonium hydroxides. A person of ordinary skill in the art will recognize that additional ranges of developer concentrations within the explicit ranges above are contemplated and are within the present disclosure.

For the improved processing described herein, a rinse agent can be the opposite, in the sense of negative tone versus positive development, developer. So if a negative tone pattern is formed, a rinse can be performed with a positive tone developer composition to improve the image, as exemplified below. Similarly, if a positive tone pattern is developed a mild rinse with a negative tone development agent can be used. The rinsing process is described further in the following section.

In addition to the primary developer composition, the developer can comprise additional compositions to facilitate the development process. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, ethylenediamine-tetraacetic acid (EDTA), tungstate, molybdate, or the like and combinations thereof. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure. The additives can be selected to improve contrast, sensitivity and line width roughness. The additives in the developer can also inhibit formation and precipitation of metal oxide particles.

With a weaker developer, e.g., lower concentration developer, a higher temperature development process can be used to increase the rate of the process. With a stronger developer, the temperature of the development process can be lower to reduce the rate and/or control the kinetics of the development. In general, the temperature of the development can be adjusted between the appropriate values of an aqueous solvent. Additionally, developer with dissolved organometallic coating material near the developer-coating interface can be dispersed with ultrasonication during development.

The developer can be applied to the patterned coating material using any reasonable approach. For example, the developer can be sprayed onto the patterned coating material, or the structure can be dipped or otherwise immersed in the developer. Also, spin coating can be used. For automated processing, a puddle method can be used involving the pouring of the developer onto the coating material in a stationary format. If desired spin rinsing and/or drying can be used to complete the development process. After the image is developed, the coating material is disposed on the substrate as a pattern.

Rinsing

As discussed above, after the step of development, there can be residual, unexposed, or underexposed photoresist between patterned features. This residue can skew the quality of the patterned profiles and affect the efficacy of subsequent pattern transfer processes based on etching. As described herein, a rinse step can be used to remove such residue. For embodiments based on negative development, a rinse in an aqueous quaternary ammonium hydroxide, such as aqueous tetramethylammonium hydroxide (TMAH), after development in an organic solvent can effectively remove photoresist residue to enhance pattern fidelity and reduce or eliminate microbridge defects. Such rinsing can be accomplished by any of a number of rinsing methods, including, by way of example, (i) immersion of wafers into a bath, (ii) dispensing the rinse solution though spray nozzles directly onto the wafer, and (iii) placing the wafer into an overflowing rinse tank. For automated processing, the rinse can be performed, for example, with a puddle method in which the rinse solution is deposited on the wafer surface, and spun or blown dry to complete the rinse process. A person of ordinary skill in the art will recognize that other rinsing methods are contemplated and are within the present disclosure.

To rinse the negative patterned substrate, an alkaline rinse agent can be used. To avoid the introduction of metals, it can be desirable to use a quaternary ammonium hydroxide, such as are described above as developers of a positive resist. In some embodiments, the rinse solution can comprise between from about 0.5 to about 30 weight percent, in further embodiments from about 1 to about 25 weight percent and in other embodiments from about 1.25 to about 20 weight percent tetra-alkylammonium hydroxide or similar quaternary ammonium hydroxides. In yet further embodiments, the rinse solution comprises 2.38% w/w tetramethylammonium hydroxide (TMAH). A person of ordinary skill in the art will recognize that additional ranges of concentrations of tetramethylammonium hydroxide (TMAH) can be used.

As demonstrated in the examples below, the rinse time can be adjusted to achieve a desired improvement in pattern uniformity as well as selecting a line width. A selected rinse time can also be influenced by the rinse agent concentration and rinse temperature. Based on suitable process times for automated processing, generally the rinse times can be designed to be from at least about a second, in other embodiments from about 2 seconds to about 30 minutes, in further embodiments from about 4 seconds to about 20 minutes, and in other embodiments from about 6 seconds to about 5 minutes. A person of ordinary skill in the art will recognize that additional ranges of rinse times within the explicit ranges above are contemplated and are within the present disclosure. The rinse generally is believed to reduce the thickness of the patterned resist. The amount of thickness of patterned resist is expected to be roughly similar to half the magnitude of the line width narrowing since the line width is narrowed from both directions. If desired, the thickness deposited for the resist can be correspondingly adjusted, but a small decrease in pattern thickness may not alter further processing. Following rinsing, the patterned structure can be used to deposit onto or etch from the substrate as a step to product formation.

Pitch can be evaluated by design and confirmed with scanning electron microscopy (SEM), such as with a top-down image. As used herein, pitch refers to the spatial period, or the center-to-center distances of repeating structural elements, and as generally used in the art a half-pitch is a half of the pitch. Feature dimensions of a pattern can also be described with respect to the average width of the feature, which is generally evaluated away from corners or the like. Also, features can refer to gaps between material elements and/or to material elements. The rinse can be used to decrease the widths of features while correspondingly increasing the gap while removing bridges and imperfections from the initial development. Average line-width roughness can be no more than about 5 nm and in some embodiments no more than about 4.8 nm. Evaluating line-width roughness is performed by analysis of top-down SEM images to derive a 3σ deviation from the mean line-width. The mean contains both high-frequency and low-frequency roughness, i.e., short correlation lengths and long correlation lengths, respectively. The line-width roughness of organic resists is characterized primarily by long correlation lengths, while the present organometallic coating materials exhibit significantly shorter correlation lengths. In a pattern transfer process, short correlation roughness can be smoothed during the etching process, producing a much higher fidelity pattern. A person of ordinary skill in the art will recognize that additional ranges of pitch, average widths and line-width roughness within the explicit ranges above are contemplated and are within the present disclosure. Based on these processes, the patterning can be adapted to the formation of various devices such as electronic integrated circuits, generally through the repeated patterning process to form appropriately layered structures, such as transistors or other components.

EXAMPLES

Resist patterns based on negative-tone development after EUV exposure were used in the following examples. Referring specifically to FIG. 1, following the steps were followed: coat 01, bake 02, expose 03, bake 04, develop 05, and rinse 06 (except comparative examples based on control samples did not undergo any rinse). Rinse times for a set of patterns are examined.

Coating—An alkyl tin photoresist product (Inpria, Oreg., USA) was spin coated on a 300-mm diameter silicon wafer at 1307 rpm for 40 seconds. The photoresist product was an alkyl tin trialkoxide composition in an alcohol solvent as described in the '612 application.

Pre-Exposure Bake—The coated substrate was then baked on a hotplate at 100° C. for one (1) minute in an ambient atmosphere. Previous studies have suggested that such processing in the ambient air results in hydrolysis of the tin-alkoxide ligands to form the alkyl tin oxide hydroxide composition in situ. Ellipsometry was used to indicate that the film thickness was approximately 22 nm after the bake.

Exposure—The coated substrate was then exposed to EUV radiation with an ASML NXE3350 tool with Dipole90 Sigma 0.878/0.353 applied. The substrates were exposed via four different masks with various spacing between patterned lines. Each mask had patterned lines spaced at a pitch of 32 nm. The first set of examples had 16 nm of open space between the patterned lines. The second, third, and fourth examples had 17 nm, 19 nm, and 20 nm of open space between the patterned lines, respectively. Masks with larger open spaces can reflect more EUV light and, therefore, deliver a higher exposure dose to the photoresist in a set exposure time.

Post-Exposure Bake—After exposure, the coatings were subjected to a post-exposure bake (PEB) at 170° C. for one (1) minute.

Development—The exposed and baked films were then dipped in 2-heptanone (TOK, >99%) for approximately forty (40) seconds to remove unexposed portions of the photoresist film and to develop a negative-tone pattern.

Rinse—After development, each of the patterned films was then treated in 2.38% w/w aqueous TMAH solution for periods ranging from 10 to 30 seconds. Such rinsing was done by soaking the coated substrates in 2.38% w/w aqueous TMAH solution. The comparative examples did not undergo any rinsing with TMAH.

Example 1—32 nm Pitch, 16 nm Spacing with No Rinse, 10 s, 20 s, or 30 s Rinse Times This example demonstrates the formation of a resist pattern based on negative-tone development after EUV exposure with a comparison of patterning results following development with no TMAH rinse or a rinse with a selected rinse time.

Figure 8:
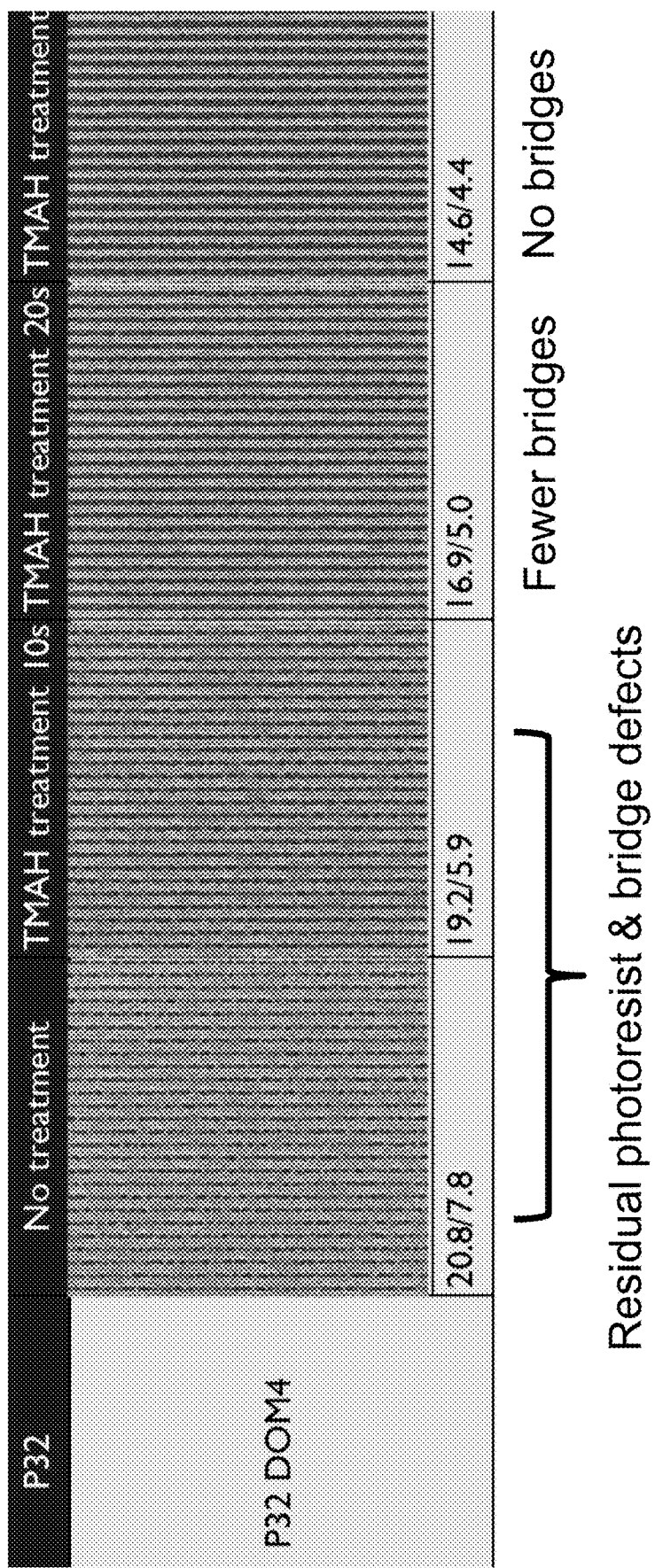
FIG. 8 is a set of four scanning electron micrographs arranged adjacent to each other with each of 32-nm pitch lines with 16-nm spacing patterned via EUV lithography, in which a left most image involved development followed by no rinse treatment, an image second from the left involving processing followed by a 10 second rinse with a rinsing solution, an image third from the left involving processing followed by a 20 second rinse with a rinsing solution, and a right most image involving processing followed by a 30 second rinse with a rinsing solution.

Four sets of patterned samples are discussed based on a pitch of patterned lines of 32 nm and an open space between the lines of 16 nm. The four samples had no rinse or rinse times of approximately ten (10) seconds, twenty (20) seconds, or thirty (30) seconds, respectively. Following the rinse, the four samples had line widths and line width roughnesses as follows:

a) No rinse—20.8 nm and 7.8 nm (FIG. 8, 1st image from left)
b) 10 s Rinse Time—19.2 nm and 5.9 nm (FIG. 8, 2nd image);
c) 20 s Rinse Time—16.9 nm and 5.0 nm (FIG. 8, 3rd image from left); and
d) 30 s Rinse Time—14.6 nm and 4.4 nm (FIG. 8, fourth image from left).

The progressively decreasing line width as the samples are rinsed for a longer period of time reflects the removal of unexposed and underexposed photoresist residue along the edges of the pattern and elimination of microbridge defects. The resulting more uniform structure is visible in the scanning electron micrographs of FIG. 8. The line widths also decrease as a result of the rinse. A corresponding small decrease in height of the remaining resist composition is believed to take place, but the post rinse pattern height was not measured.

Example 2—32 nm Pitch with Various Line Spacings, with No Rinse, 10 s, 20 s, or 30 s Rinse Time This example demonstrates the effect of a post development alkaline rinse on samples prepared with a range of line spacings.

The samples in this example had a pitch of patterned lines of 32 nm, and line widths (pre-rinse line widths) of 16 nm, 17 nm, 19 nm or 20 nm. For each line width, different samples were subjected to rinse times of approximately ten

(10) seconds, twenty (20) seconds or thirty (30) seconds, respectively. Control samples (CS) were prepared without a rinse for comparison. Following the rinse, the samples were evaluated by SEM to determine post rinse line widths and line width roughnesses. See FIG. 9. The results are presented in Table 1.

TABLE 1

| Sample | Line Width - pre (nm) | Rinse Time (s) | Line Width - post (nm) | Line Width Roughness (nm) |
|---|---|---|---|---|
| CS1 | 16 | 0 | 16.3 | 3.8 |
| 1 | 16 | 10 | 14.7 | 3.8 |
| 2 | 16 | 20 | 11.4 | 4.1 |
| 3 | 16 | 30 | 9.7 | 4.2 |
| CS2 | 17 | 0 | 17.6 | 3.9 |
| 4 | 17 | 10 | 15.8 | 3.9 |
| 5 | 17 | 20 | 12.8 | 4.1 |
| 6 | 17 | 30 | 11.1 | 4.1 |
| CS3 | 19 | 0 | 20.8 | 7.8 |
| 7 | 19 | 10 | 19.2 | 5.9 |
| 8 | 19 | 20 | 16.9 | 5.0 |
| 9 | 19 | 30 | 14.6 | 4.4 |
| CS4 | 20 | 0 | 21.0 | 9.4 |
| 10 | 20 | 10 | 20.4 | 7.5 |
| 11 | 20 | 20 | 19.0 | 5.5 |
| 12 | 20 | 30 | 17.0 | 4.7 |

The progressively decreasing line width as the samples are rinsed for a longer period of time reflects the removal of unexposed and underexposed photoresist residue and elimination of microbridge defects. The control samples (CS1-CS4) provide the nominal line widths directly resulting from the initial patterning.

As can be seen by the examples, a wide process window is available to produce a line-space pattern with targeted dimensions. If a user desires a certain feature size/width, the user can select a mask size (pitch and/or line spacing), solution, and rinse duration to obtain the desired feature size/width. By way of example, if a user desires a feature size/width of about 13 nm and the user has a mask with a pitch of 32 nm and line width of 17 nm, the user can rinse the patterned film in a 2.38% w/w aqueous TMAH solution for a periods of about twenty (20) seconds to obtain the desired feature size/width of 13 nm. Prior to the rinse, the feature would have a line width of about 17.61 nm.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A method for forming an adjusted patterned structure, the method comprising rinsing an initial patterned structure with a rinse solution to remove a portion of developed photoresist to control pattern dimensions and to form an adjusted patterned structure,
wherein the initial patterned structure was formed by (i) coating the surface of the substrate with an organometallic radiation sensitive resist material to form the radiation sensitive resist film, (ii) exposing the radiation sensitive resist film to patterned radiation to form an exposed film with exposed portions and unexposed portions, and (iii) contacting the exposed film with a developing solution to form a developed photoresist wherein either the exposed portions or the unexposed portions are selectively soluble in the developing solution.

2. The method of claim 1 wherein the rinse solution comprises aqueous quaternary ammonium hydroxide and the developing solution comprises an organic solvent.

3. The method of claim 1 wherein the developing solution comprises aqueous quaternary ammonium hydroxide and the rinse solution comprises an organic solvent.

4. The method of claim 1 wherein the rinse solution is about 0.5 to 30 weight percent aqueous tetramethyl ammonium hydroxide (TMAH).

5. The method of claim 1 wherein the organometallic radiation sensitive resist material comprises an alkyltin oxide hydroxide approximately represented by the formula $R_zSnO_{(2-z/2-x/2)}(OH)_x$, where $0<x<3$, $0<z\le2$, $x+z\le4$, and R is a hydrocarbyl group forming a carbon bond with the tin atom.

6. The method of claim 1 wherein the organometallic radiation sensitive resist material comprises monoalkytin oxide hydroxide.

7. The method of claim 1 wherein the developing solution comprises a ketone.

8. The method of claim 1 wherein the developing solution comprises 2-heptanone.

9. The method of claim 1 wherein the substrate is a silicon wafer.

10. The method of claim 1 wherein the radiation sensitive resist film is exposed to extreme ultraviolet radiation at a dose of no more than about 100 mJ/cm$^2$ or with an electron beam at a dose no more than about 2 mC/cm$^2$ at 30 kV.

11. The method of claim 1 wherein the patterned structure has an initial dry thickness prior to the step of rinsing, and a final dry thickness after the step of rinsing, wherein the initial dry thickness is from about 1 nm to about 50 nm and the final dry thickness is from about 1 nm to about 50 nm.

12. The method of claim 1 wherein the rinse solution is about 0.5 to about 30 weight percent aqueous tetramethyl ammonium hydroxide, aqueous tetrapropylammonium hydroxide, aqueous tetrabutylammonium hydroxide, or combinations thereof.

13. The method of claim 1 wherein the initial patterned structure is rinsed with the rinsing solution for at least about one (1) second.

14. The method of claim 1 wherein a duration of rinsing and a concentration of the rinse solution are selected to produce a desired feature size of the patterned structure.

15. The method of claim 1 wherein the rinsing solution comprises tetramethylammonium hydroxide (TMAH), and wherein a space sizing and a pitch of the patterned radiation, duration of rinse, and a concentration of the TMAH in the solution are selected to produce a desired feature size and/or resolution of the adjusted patterned structure.

16. The method of claim 1 wherein the adjusted patterned structure has an average line-width roughness that is no more than about 5 nm.

17. The method of claim 1 further comprising:
either a step of A) depositing a material based on the adjusted patterned structure or B) etching the substrate based on the adjusted patterned structure; and
removing the adjusted patterned structure to form a processed substrate.

18. The method of claim 17 further comprising forming a subsequent patterned structure on the processed substrate.

19. The method of claim 1 further comprising forming the initial patterned structure wherein the developing solution comprises an organic solvent and wherein the rinse solution comprises a quaternary ammonium hydroxide.

20. The method of claim 1 wherein the rinsing step is performed using a puddle method wherein the rinsing solution is applied to the surface of the initial patterned structure and dried by spinning and/or blowing following a selected period of time.

21. The method of claim 1 wherein the radiation sensitive resist material comprises a monoalkyl tin oxide hydroxide.

22. The method of claim 21 wherein the radiation sensitive resist material is exposed to extreme ultraviolet radiation at a dose of no more than about 100 $mJ/cm^2$, the initial dry thickness of the patterned structure is no more than about 50 nm, and wherein a duration of rinse and concentration of the rinsing solution are selected to produce a desired feature size and/or resolution of the patterned structure.

23. The method of claim 1 wherein the radiation sensitive resist material is suitable for either positive tone or negative tone development, and wherein if the initial pattern is formed using a developer to form a negative tone pattern, the rinse composition comprises a suitable composition to perform positive development of the radiation sensitive resist material, or if the initial pattern is formed with a developer to form a positive tone pattern, the rinse composition comprises a suitable composition to form a negative tone pattern.

* * * * *